United States Patent [19]
Katsuki et al.

[11] Patent Number: 5,359,208
[45] Date of Patent: Oct. 25, 1994

[54] CHIP PACKAGE WITH MICROLENS ARRAY

[75] Inventors: Kazuo Katsuki, Osaka, Japan; John C. Connolly, Monmouth Junction, N.J.; Thomas T. Hitch, Lawrenceville, N.J.; Robert R. Demers, Cranbury, N.J.

[73] Assignee: Nippon Sheet Glass Co., Ltd., Osaka, Japan

[21] Appl. No.: 23,598

[22] Filed: Feb. 26, 1993

[51] Int. Cl.⁵ .............................................. H01L 31/12
[52] U.S. Cl. .................................... 257/82; 257/84; 257/98; 257/99; 257/432; 257/434; 385/49
[58] Field of Search ............... 257/432, 434, 433, 98, 257/99, 81, 80, 82, 84; 385/116, 120, 49

[56] References Cited

U.S. PATENT DOCUMENTS

| | | | |
|---|---|---|---|
| 4,225,213 | 9/1980 | McBride, Jr. et al. | 257/433 X |
| 4,862,231 | 8/1989 | Abend | 257/98 X |
| 5,093,879 | 3/1992 | Bregman et al. | 257/80 X |

FOREIGN PATENT DOCUMENTS

| | | | |
|---|---|---|---|
| 3911543 | 8/1990 | Fed. Rep. of Germany | 385/116 |
| 55-151377 | 1/1980 | Japan | 257/434 |
| 56-79468 | 6/1981 | Japan | 257/432 |
| 56-91482 | 7/1981 | Japan | 257/433 |
| 62-52961 | 3/1987 | Japan | 257/98 |
| 0216768 | 1/1990 | Japan | 257/434 |

*Primary Examiner*—William Mintel
*Attorney, Agent, or Firm*—Ratner & Prestia

[57] ABSTRACT

A chip package for an IC chip having at least an optical-signal input or output section comprises a container-like chip carrier for carrying the IC chip, a sealing cover bonded to the chip carrier and having a window for the optical-signal section, and a connector plate holding a plurality of optical signal transmission elements which are used to transmit a plurality of optical signals en bloc so that optical signals are input to or output from the optical-signal section through the window on the cover. The chip carrier and the connector plate are securely attached to a circuit board in the state where the connector plate has been separately positioned in a predetermined spatial relationship with the chip carrier.

12 Claims, 9 Drawing Sheets

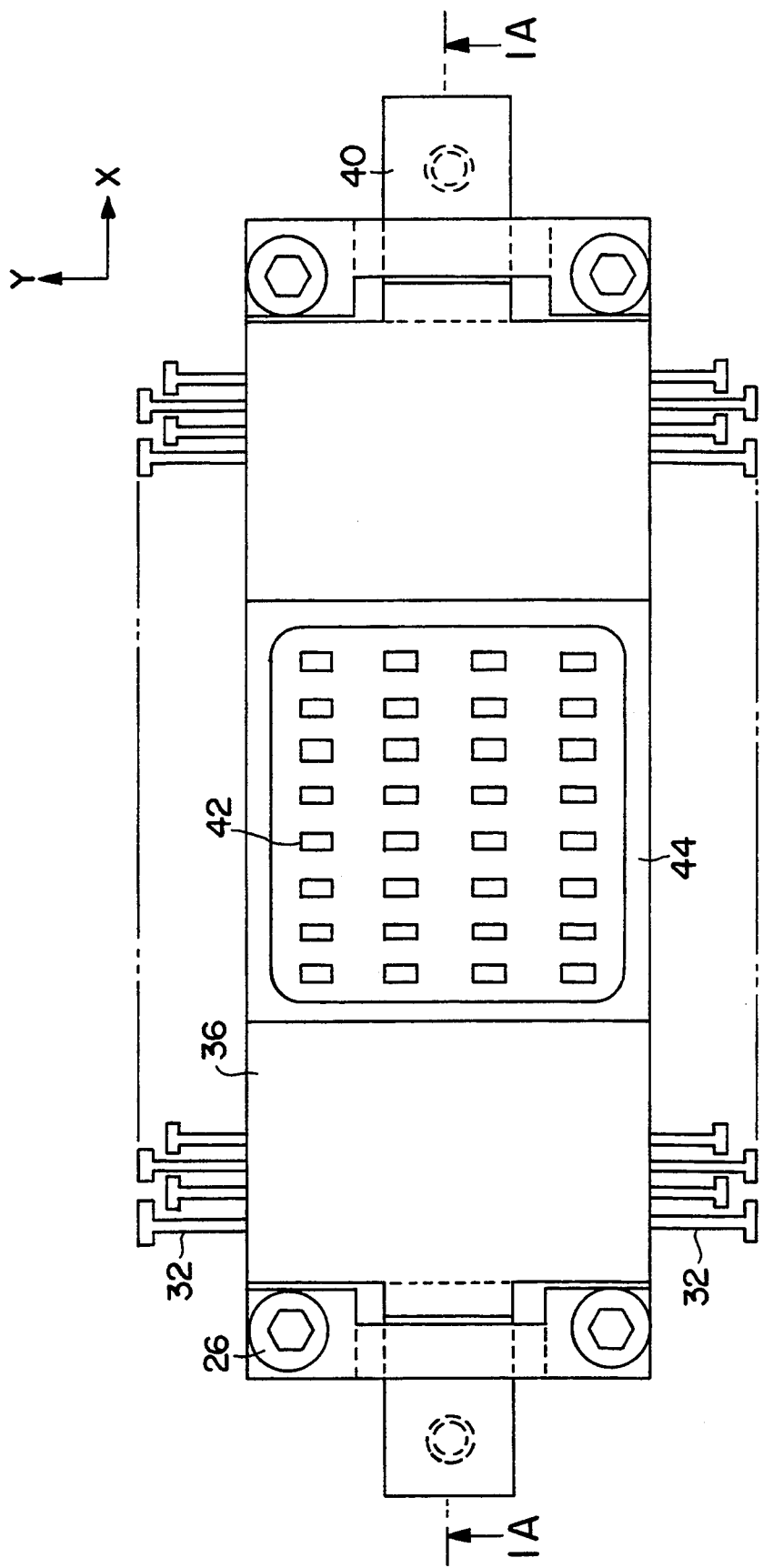
FIG. IB

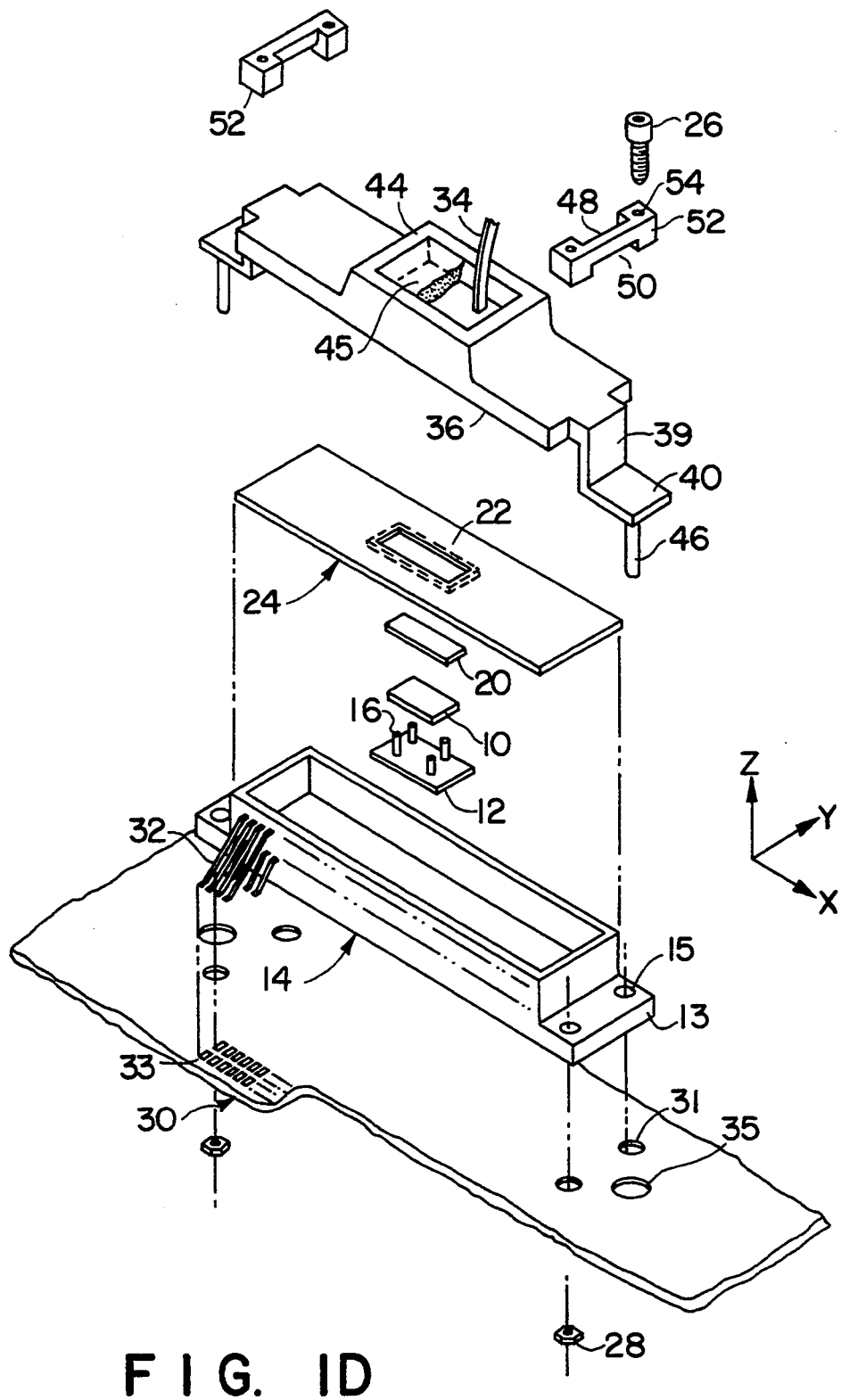
FIG. ID

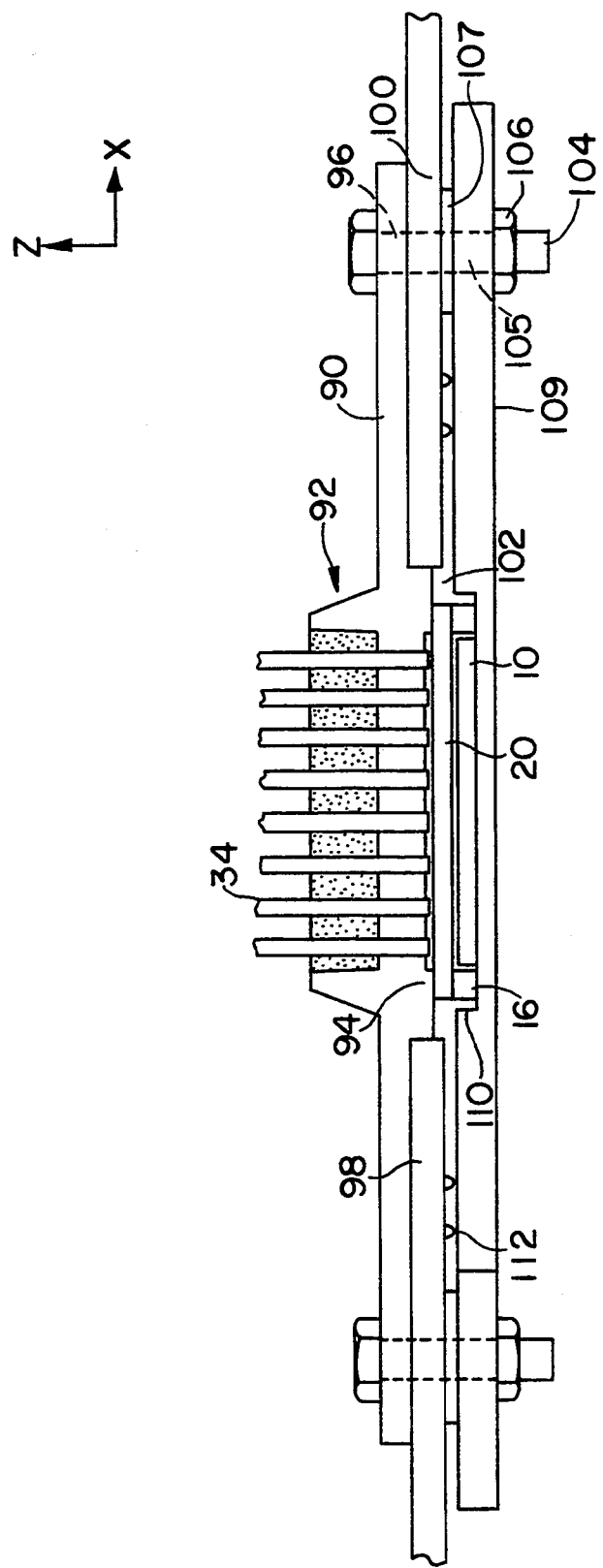
F I G. 3B

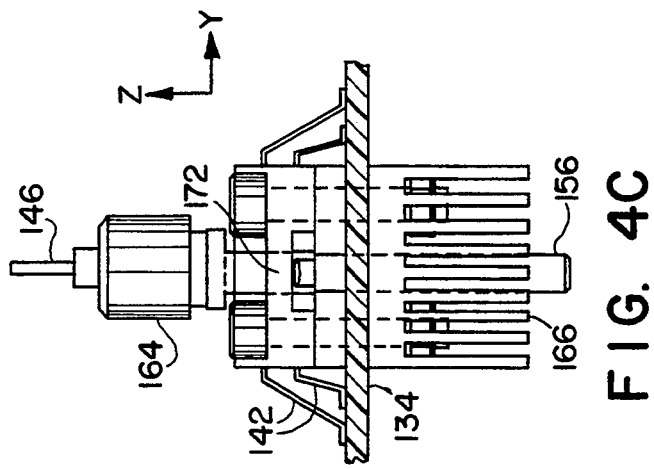
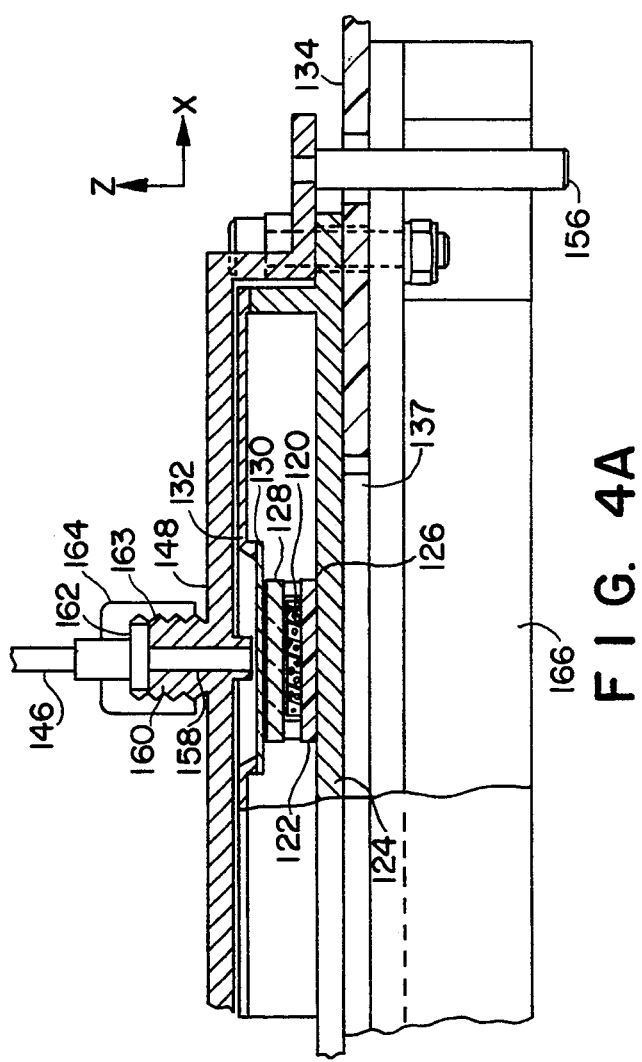
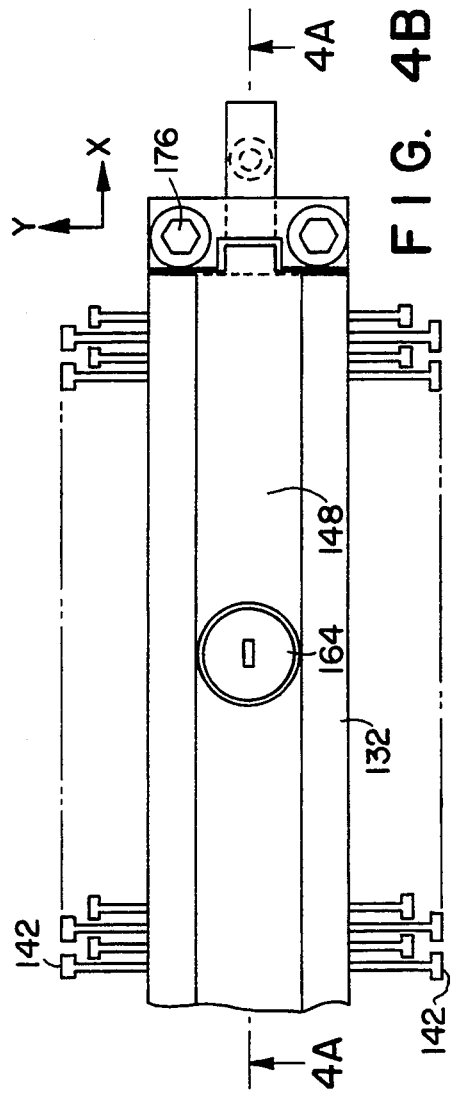

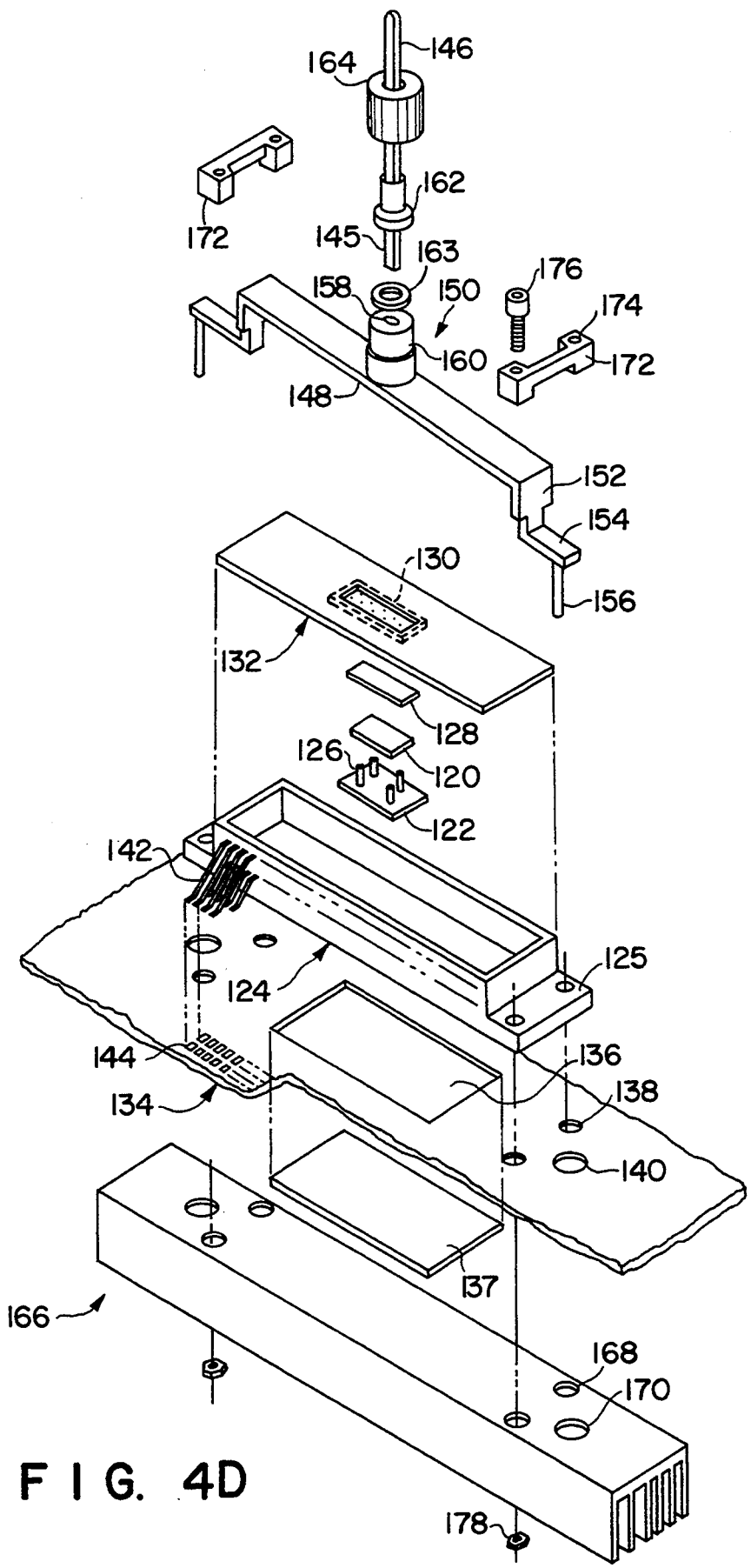
F I G. 4D

CHIP PACKAGE WITH MICROLENS ARRAY

BACKGROUND OF THE INVENTION

1. FIELD OF THE INVENTION

This invention is concerned with a new integrated circuit package and in particular to such a package which enables the integrated circuits to be optically interconnected and which handles optical inputs and outputs in parallel.

2. DESCRIPTION OF THE PRIOR ART

The processing speed of processors has been increasing at an astounding pace in recent years, and the demand for higher-speed processors is also growing. Efforts to meet this demand have been concentrated not only on manufacturing higher-speed integrated circuits (ICs) but also on improving processor architectures. Increasing processing speed by improving individual processor architecture, however, seems to approach its own limits.

More recently, the need for higher processing speed is being met by providing a variety of parallel processing systems. In these parallel systems, if communications among processors are inadequate, the functions of the parallel processors system cannot be fully accomplished. Thus, complex, multiple path inter-board wiring is needed, which increases the cost of the processors. Attempts has been made to construct an architecture that divides functions within a processor, but, as yet, none of these architectures has reached commercial usefulness.

A processor architecture has been proposed which incorporates the concept of a multi-chip module (MCM) in a U.S. patent application filed on Mar. 25, 1992, Ser. No. 07/857,626 under the title of "PARALLEL DIGITAL PROCESSING SYSTEM USING OPTICAL INTERCONNECTIONS." That is to say, this proposal represents the separation of the processor section from the control-memory section. In this architecture, the processor section uses a group of processor units arranged in an array on a single chip. The architecture can easily accomplish the mutual communications among the processor units. The above-mentioned application has also proposed a system of inputting a large number of data and control signals into the processor chip in the form of optical signals.

In general, there are several means for implementing the parallel operation of processors, such as upgrading IC-chip architecture, and improving communications between chips. In order to enhance IC-chip architecture, or use wider-bandwidth buses for communications, it is desirable to improve the characteristics of chip packages, and such efforts are now being vigorously pursued.

As a result of the dramatic progress of semiconductor device fabrication technology, the number of transistors fabricated on a chip has been greatly increased. Miniaturization of transistors has also brought about reductions in the gate length of MOS transistors and in the electron diffusion layers of bipolar transistors, which has resulted in an increase in processing speed. These advances have permitted ICs to operate using substantially increased clock rates.

To effectively use these high-speed processing operations, it is desirable to allow data or control signals to be transferred at high-speed when the occasion demands. The demand for higher-speed and larger numbers of data transmission paths still remains strong even though the need for high-speed processing has already been partially satisfied by providing cache memories in the systems.

Development efforts have been rapidly stepped up to increase the number of input/output ports for a chip as the most immediate means for implementing these demands. That is, development efforts are being directed towards improving existing chip packages which hold chips and connect them to external circuits, in addition to developing entirely new packages.

Efforts are also being directed towards increasing the number of terminals (i.e., pins) on pin grid array (PGA) packages, or leads on quad flat packages (QFP). A simple method for increasing the number of terminals on a chip package is to increase the area on which pins are mounted. This has not been effective, however, because it inevitably involves an increase in package size which reduces the number of components that can be mounted on a fixed-size circuit board and, so, is not always effective as a method of reducing the size of systems.

Another improvement which is being energetically pursued is to increase terminal density on a package to as fine as 0.3 mm pitch on PGA packages. A method of mounting pins on the entire bottom surface of the package has also been attempted. In the field of QFPs, there is a continuing challenge to reduce the outer pitch of the leads. Needless to say, improvement efforts are also being made concerning the technology of soldering leads on circuit board pads.

Now, typical characteristics required of IC packages will be briefly explained. First comes the need to increase the number of terminals to keep up with the ever-increasing degree of transistor integration, as noted earlier; second, the need to minimize the delay for the signals entering or leaving a chip; third, the need to match the thermal expansion coefficients of chip and package materials; fourth, the need to meet the high heat dissipation requirement of the larger IC's; fifth, the need to simplify interconnection to other devices (circuit boards); sixth, the need for smaller systems, or downsizing; and last the need to maintain sufficient reliability.

The reliability of a chip involves various requirements: above all, positive and stable interconnections to other devices, and also positive and stable sealing of packages which require sealing.

Improvements are constantly under way on the aforementioned PGA and QFP packages to meet these requirements. New chip package mounting methods include the bare-chip package mounting, such as the chip-on-board (COB) and the tape carrier package (TCP) techniques. The COB mounting method interconnects chips directly onto a circuit board or via carriers without packaging other than an encapsulant (glob top). The most COB common terminal connection being flip-chip bonding, although wire bonding is also commonly used.

The flip-chip bonding technique, using grid arrays of solder bumps, can accommodate probably the largest number of terminals, but this technique also requires utmost care in soldering. In addition, it is desirable to pay careful consideration to the distribution and matching of mechanical and thermal external forces between the chip, the chip carrier and the circuit board. The mechanical external forces, such as those caused by thermal expansion, are applied directly to the chip in this process.

The TCP technique relates to tape automated bonding (TAB). This technique uses a carrier made of a plastic film, and bare chips having bumps which are bonded directly to the inner leads of metal foil interconnects on the film carrier. The TCP process has characteristics compatible to multi-pin connections as in the case of the COB mounting, and packages produced are relatively small, light-weight and thin. The TCP process can be used to realize fine-pitch fabrication and reduced inner bonding pad pitches. This is so because the process makes submil (i.e. less than 0.001 in.) inner lead pitch fabrication possible by using an electrically conductive foil bonded to a plastic film.

For the most part, in COB, TCB and other bare-chip package mounting techniques, all terminals are bonded either en bloc or automatically in rapid succession, to produce a bond strength which is several times higher than wire bonding. This advantage may pose a disadvantage, however, because chips, once bonded into circuits, may be hard to remove, making it difficult to repair the device.

With the state-of-the-art technology, the number of terminals that can be fabricated is less than about 1000, and chips having 200 to 300 terminals are more commonly used.

Improvements of processor performance are being continually pursued to such an extent that chips having several ALUs (arithmetic and logic units) are commercially available. To effectively use these new processors, however, it is desirable to provide multiple high speed parallel signal input/output ports.

SUMMARY OF THE INVENTION

It is an object of this invention to provide a chip package for optically interconnected chips that perform parallel optical input and output operations.

The chip package of this invention has an electrical-signal input/output section and an optical-signal input section, an optical-signal output section or both. It holds an IC chip which performs digital data processing. The chip package comprises a container-like chip carrier which holds the aforementioned IC chip and has a group of electrical-signal input/output terminals and a cover bonded to the chip carrier in such a manner as to seal the chip carrier. The cover has a window for the aforementioned optical-signal section, and a connector plate holding a plurality of optical-signal transmission elements. The plurality of optical-signal transmission elements transmit a plurality of optical signals en bloc so that optical signals are conveyed to or from the optical-signal section through the window on the cover. The chip carrier is mounted securely to a circuit board and the optical signal transmission elements are positioned on, and attached to the chip carrier. The electrical-signal input/output terminal group of the chip carrier is connected to the circuit board.

According to another aspect of the invention, the chip package of this invention has a connector plate which holds said plurality of optical-signal transmission elements. The chip carrier and the connector plate are securely mounted on the circuit board in the state where the connector plate has been positioned on the chip carrier.

According to another aspect of the invention, the chip package is securely mounted to the surface of a circuit board which has an opening. The chip carrier is positioned from the rear surface side of the circuit board through the opening before the chip package is securely attached to the connector plate.

According to yet another aspect of the invention, the chip package of this invention includes a light-emitting element array. The carrier includes an adapter which holds an optical-signal transmission element that transmits a plurality of optical signals en bloc so that optical signals from the chip are output through the window on the cover. The carrier further includes a heat sink for dissipating the heat generated by the light-emitting element array. The chip carrier and the adapter are securely mounted to the surface of the circuit board such that the adapter is positioned and disposed on the chip carrier and the heat sink is securely attached to the rear surface of the circuit board.

BRIEF DESCRIPTION OF THE DRAWINGS

FIG. 1B is a top plan view of the processor-chip package/shown in FIG. 1A.

FIG. 1D is an exploded perspective view of the processor-chip package shown in FIG. 1A.

FIG. 3B is a partial cross-sectional view of the front part of another exemplary processor-chip package which is adapted to permit fine position adjustments to be performed on the chip carrier.

FIG. 4A is a partial cross-sectional view of the front part of another exemplary processor-chip package which includes an array of light-emitting elements.

FIG. 4B is a top plan view of the light-emitting element array package shown in FIG. 4A.

FIG. 4C is a side plan view of the light-emitting element array package shown in FIG. 4A.

FIG. 4D is an exploded perspective view of the light-emitting element array package shown in FIG. 4A.

DETAILED DESCRIPTION OF THE EXEMPLARY EMBODIMENTS OF THE INVENTION

Figure 1A:
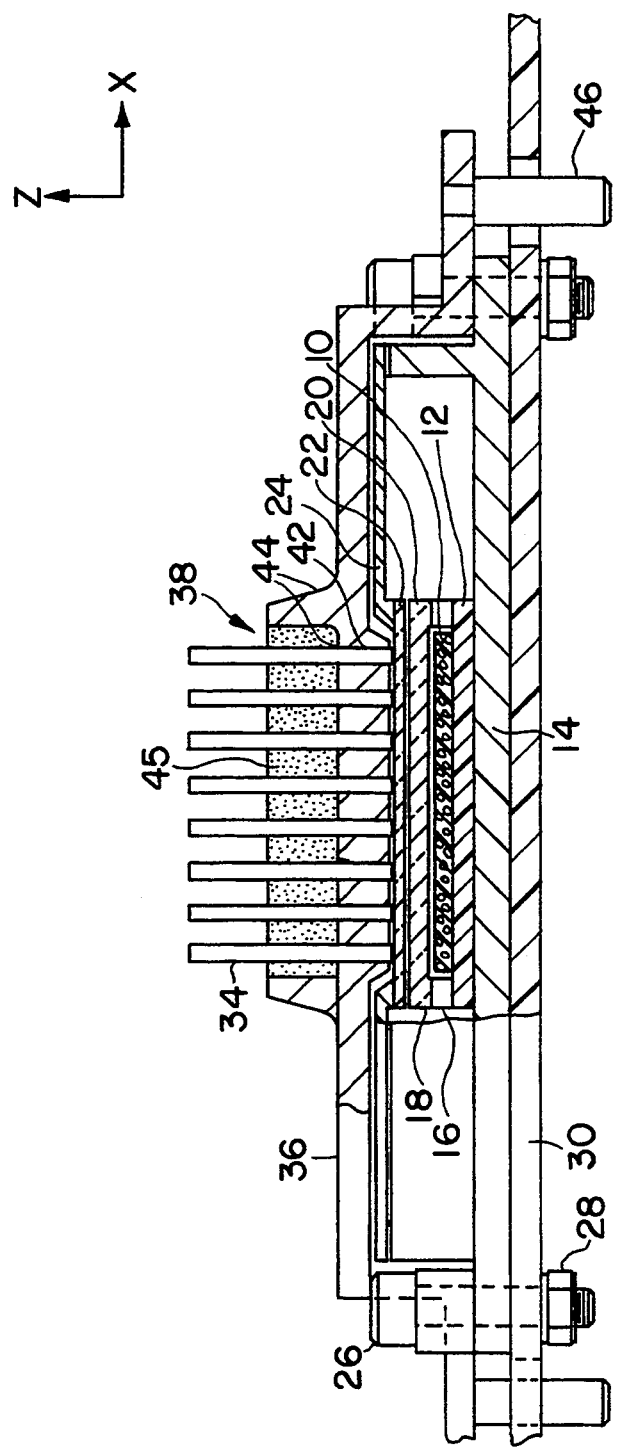
FIG. 1A is a partial cross-sectional view of the front part of a processor-chip package.
Figure 1C:
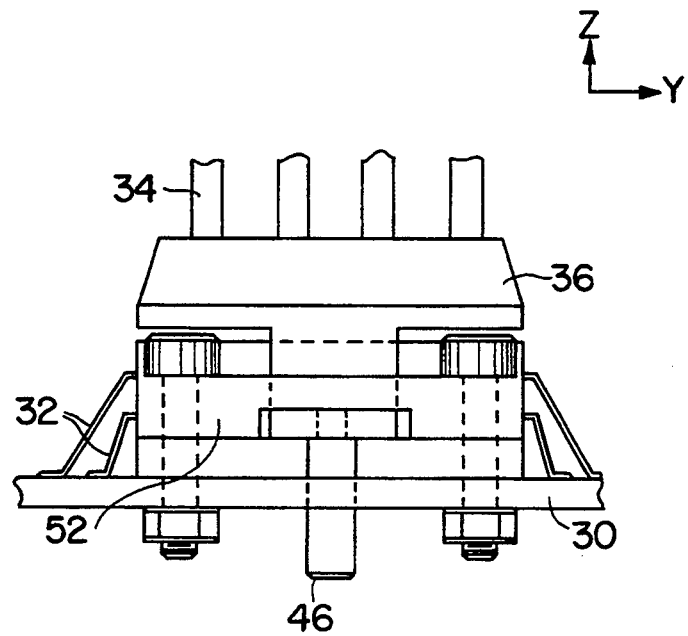
FIG. 1C is a side plan view of the processor-chip package shown in FIG. 1A.

First, a processor-chip package incorporating a plurality of arithmetic processor units each of which receives optical signals is described. FIG. 1A is a cross-sectional view of the front part of a processor-chip package. FIG. 1B is a top plan view of the package, FIG. 1C is a side view of the package and FIG. 1D is an exploded perspective view of the package. FIG. 1A is taken essentially along the line A—A shown in FIG. 1B. Since many of the elements described below appear in more than one of the drawing figures, no references to individual FIGS. 1A, 1B, 1C and 1D are made.

A processor chip 10, which has an optical-input cell array as the light receptor, is securely attached to a container-like chip carrier 14 via a sub-carrier 12. Four supporting posts 16 are fixedly fitted to the sub-carrier 12. The upper end faces of the posts 16 are bonded to a microlens array 20 having multiple microlenses. The microlens array 20 is positioned so as to be substantially perfectly parallel to the surface of the chip 10.

The optical sensor elements in the processor chip are arranged in a plurality of optical-input cell arrays each cell of which is approximately 20×20 μm in size, and corresponds to one of the microlenses. The microlenses focus incident light onto the corresponding optical sensor elements. Consequently, to ensure that the signals are properly delivered, it is desirable to accurately determine the relative positions of the optical sensor element array and the microlens array in three axes. The three axes are the X axis and the Y axis lying in a plane parallel to the surface of the processor chip, and the Z axis normal to the X-Y plane.

The microlens array 20 is bonded to the post 16 by applying an adhesive 18 to the upper end face of the each of the posts 16. The microlens array 20 is then positioned in the X and Y axis directions with respect to the optical-input cell array. The microlens array is aligned to the optical cell arrays on the processor chip while a reference light is shone onto the microlens array 20. Once it is properly aligned, the adhesive 18 is allowed to set. The Z-axis position of the microlens array 20 is determined by the height of the post 16.

The chip carrier 14 has a shape of a box-like container with the upper end face open, and has fixing tabs 13 protruding towards both sides of the container in the X-axis direction. Each of the fixing tabs 13 has two mounting holes 15. The material for the chip carrier 14 and the sub-carrier 12 are desirably selected from among those materials having good heat conduction properties, in order to dissipate the heat produced by the processor chip 10. In addition, the chip carrier 14 may be coupled to a heat sink mounted on the back side of the circuit board, such as the heat sink 166 shown in FIGS. 4A through 4D.

The upper part of the chip carrier 14 is sealed with a metal cover 24 which includes a window 22. The window 22 may be fabricated from transparent glass, sapphire or other material which is transparent at the wavelength of the optical signals to be used. The metal cover completely and stably seals the inside of the chip carrier containing the processor chip 10 from the outside environment. This sealing is desirable to prevent signal distortion which may be caused by the infiltration or deposition of minute dust and dirt particles in the light propagation path. Depending on the type of semiconductor material used for the processor chip 10, it may also be desirable to hermetically seal the chip carrier 14 to prevent degradation of the semiconductor elements which may be caused, for example, by water vapor.

The sealed chip carrier 14 is mounted on a circuit board 30. The circuit board 30 has four holes 31 for mounting the package. When mounting the chip carrier 14 on the circuit board 30, the mounting holes 15 on the chip carrier 14 are aligned with circuit board mounting holes 31. Electrical connections, (i.e. leads) 32 are provided on both sides of the chip carrier 14. In this example, since the density of leads is too high to form a single row of connecting pads on the circuit board 30, the leads are provided in two rows. The ends of these leads are soldered to or through connecting pads 33 on the circuit board 30. Thus, the chip carrier 14 is fixedly fitted on the circuit board 30.

Over the cover 24, a connector plate 36 is included which holds a plurality of optical-fiber bundles 34. In the center of this connector plate 36 is an optical-fiber bundle holder 38, facing the light-transmitting window 22 of the cover 24. The connector plate 36 has legs 39 on both of its ends, which extend downwards in the Z-axis direction. Fixing tabs 40 extend in the X-axis direction from the legs 39. The connector plate 36 also includes position-adjusting pins 46 which protrude downward in the z-axis direction and which are securely attached to the fixing tabs 40.

The fiber bundle holder 38 comprises a slot array consisting of a plurality of slots 42 formed on the connector plate proper, for example, by discharge machining. The fiber bundle holder 38 also includes a recess with a raised rim 44 formed in such a manner as to encircle the slot array. Each optical-fiber bundle 34 is inserted into a respectively different one of the slots 42.

The optical-fiber bundle 34 includes multiple optical fibers, each of which can transmit an optical signal. The layout of the slot array for supporting the bundles is determined in such a manner that a group of optical signals transmitted through the bundles is precisely aligned to respective elements of the optical-input cell array on the processor chip 10.

Each optical fiber bundle 34 inserted into each slot 42 is securely held in position by the connector plate 36 using a cementing medium 45 poured in the recess formed by the raised rim 44.

The connector plate 36 with its plurality of optical-fiber bundles 34 is mounted on the circuit board 30 in the following manner. As noted earlier, the chip carrier 14 has already been securely mounted on the circuit board 30. The circuit board pin 30 has two pin insert holes 35 outside of the mounting holes 31 in the X-axis direction. The position-adjusting pins 46 of the connector plate 36 are passed through these holes 35, causing the lower surface of the fixing tabs 40 of the connector plate 36 to come in contact with the upper surface of the fixing tabs 13 of the chip carrier 14.

The pin insert holes 35 are desirably large enough in diameter to allow the position-adjusting pins 46 to move in both the X and Y directions to allow for fine adjustment.

Next, end captivating straps 52 having recesses 48 which engage the legs 39 of the connector plate 36, and recesses 50 which engage the fixing tabs 40 are disposed at corners formed by the legs 39 and the fixing tabs 40. Each of the end captivating straps 52 has two fixing holes 54 adapted to be aligned with the mounting holes 15 of the chip carrier 14 and the mounting holes 31 of the circuit board 30. Mounting bolts 26 are inserted into the holes 54 of the end captivating strap 52, the holes 15 of the chip carrier 14 and the holes 31 of the circuit board 30, and tightened with nuts 28 from the rear surface of the circuit board 30.

Initially, the nuts 28 are tightened loosely so that the connector plate 36 can be moved in the X-Y plane. Note that the end faces of the optical-fiber bundles 34 inserted into the slots 42 reach near to the surface of the glass window 22 of the cover 24.

The next step is to position, the optical-fiber bundles with respect to the microlens array. To achieve this, a plurality of reference light beams, for example, reference light beams entering the optical sensor elements at the diagonally extreme points on the processor chip 10 are input using the optical-fiber bundles. The positions of the optical-fiber bundles are adjusted by observing the electrical output of the processor chip 10 while moving the connector plate 36 in parallel with the X-Y plane. The connector plate 36 is moved by manipulating the position-adjusting pins 46 protruding from the holes 35 on the back side of the circuit board 30, using a manipulator (not shown).

The accuracy of this positioning operation is not so stringent partly because of the effective light transmission range of the optical-fiber bundles is of the order of several millimeters, and partly because of the coherent image, which is transmitted through the optical fiber bundles, is generated using light emitting diode (LED) elements which are accurately positioned in a dimensional array of elements in the same alignment as the optical sensor elements and both arrays are made using IC fabrication technology.

Upon completion of the positioning of the optical-fiber bundles, the bolts 26 and the nuts 28 are tightened or the securing adhesive is applied. In this step, the end captivating strap 52 forces the fixing tab 40 of the connector plate 36 onto the fixing tab 13 of the chip carrier 14. This also attaches the connector plate 36 to the circuit board 30. The connector plate 36 is not directly mounted on the circuit board but is attached using the end captivating straps 52. This is done to avoid the alignment problems which may occur due to displacement of the connector plate 36 due to the rotational friction of the bolts. This type of displacement could occur, for example, if the connection plate were mounted in the same manner as the chip carrier 14.

Another approach to fixing the connector plate 36 once the optical fiber bundles 34 are aligned with the processor chip 10, may be to insure that the tolerances of the connector plate 36 and chip carrier 14, when the bolts are tightened, allow for controlled movement of the connector plate. In this approach, when the connector plate is aligned, the parts are secured in position using a rigid adhesive (not shown), such as cyanoacrylate. In yet another approach (not shown), the connector plate 36 may be bolted directly to the chip carrier 14 once alignment has been achieved between the optical fiber bundles 34 and the processor chip 10.

The cover 24 of the package described above has a light-transmitting window 22, but the cover 24 may be omitted and the end faces of the optical-fiber bundles may be brought into direct contact with a glass plate that includes a microlens array. A processor package of this structure is described below with reference to FIGS. 2A and 2B. FIG. 2A is a cross-sectional view of the front part of this exemplary alternative package, and FIG. 2B a side view thereof.

Figure 2B:
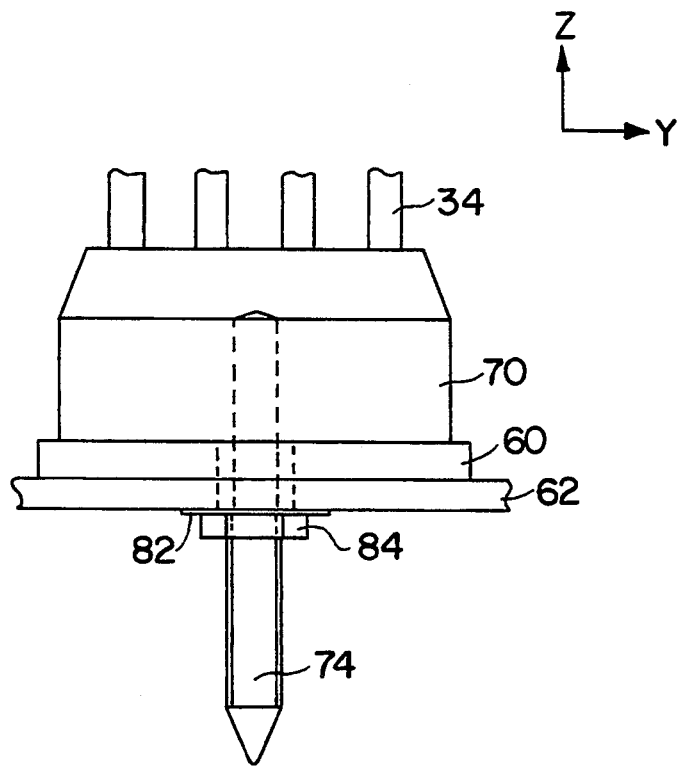
FIG. 2B is a side plan view of the processor-chip package shown in FIG. 2A.
Figure 2A:
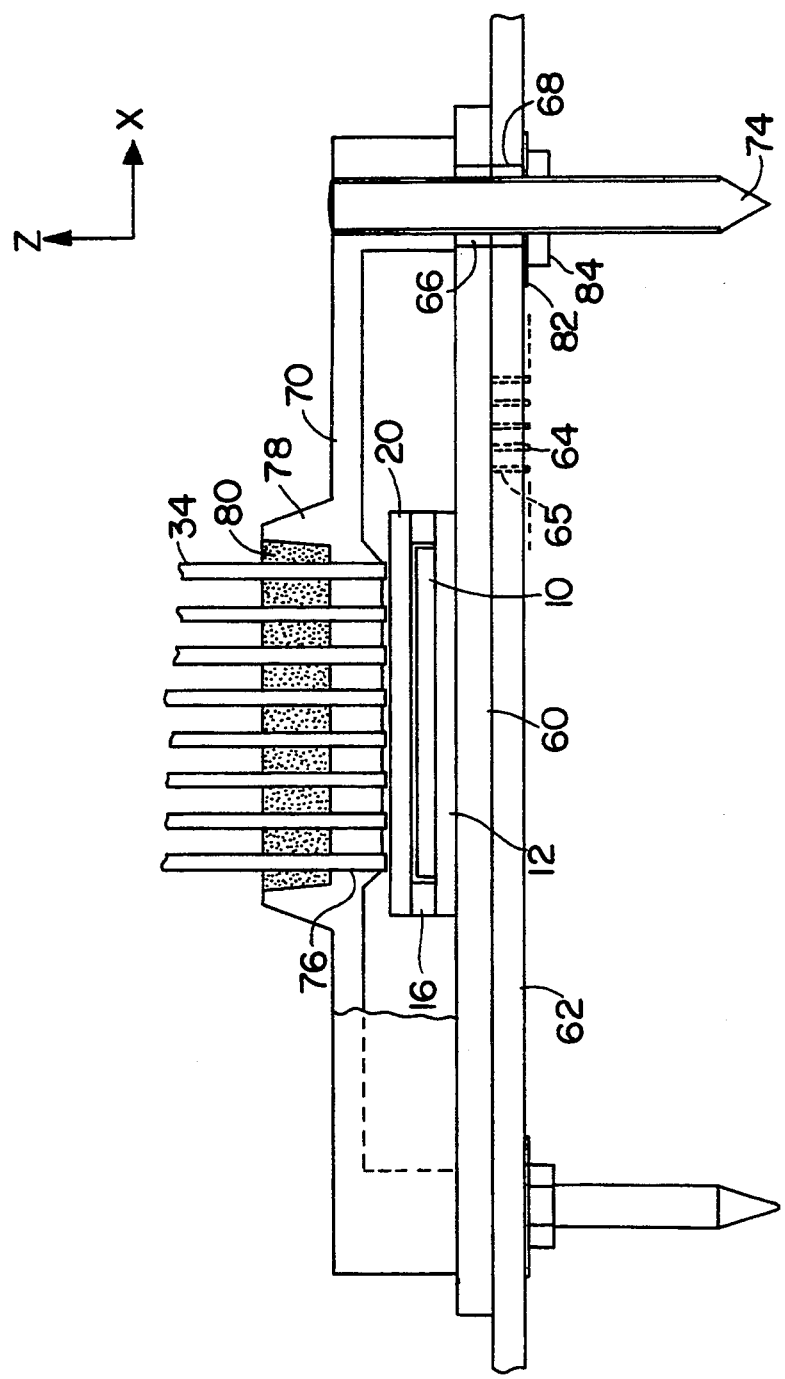
FIG. 2A is a partial cross-sectional view of the front part of an alternative processor-chip package which includes an embodiment of the invention.

Referring to FIGS. 2A and 2B, a processor chip 10 having an optical-input cell array as the light receptor is securely attached to a plate-shaped chip carrier 60 via a sub-carrier 12. Four posts 16 are mounted on the sub-carrier 12. A microlens array 20 is bonded to the upper end faces of the posts 16. The chip carrier 60 having the processor chip 10 and the microlens array 20 is secured to the circuit board 62, by inserting electrical input/output pin terminals 64, which protrude from the rear surface of the chip carrier 60, into the terminal holes 65 on the circuit board 62.

The pin terminals 64 are inserted into the terminal holes 65 until the rear surface of the chip carrier 60 comes in contact with the surface of the circuit board 62. In this configuration, external force exerted onto the chip carrier 60 is transmitted to the surface of the circuit board 62.

Two Holes 66 are provided, one at each end of the chip carrier 60, through which bolts that also serve as position-adjusting pins may be inserted. The use of these bolts as position adjusting pins is described below. In addition, two holes 68 are provided on the circuit board 62 at locations corresponding to the holes 66.

A connector plate 70 is provided on the chip carrier 60, to hold a plurality of optical-fiber bundles 34. The connector plate 70 is of a shape of a container with the bottom part thereof open, and has an optical-fiber holder at its center, facing the microlens array 20. Two fixing bolts 74, which also serve as position-adjusting pins, are embedded in the side walls at both ends in the X-axis direction of the connector plate 70.

The connector plate 70 includes a fiber bundle holder which includes a slot array consisting of a plurality of slots 76 provided on the connector plate proper, and a recess with a raised rim 78 formed in such a manner as to encircle the slot array. The end of each fiber bundle 34 is inserted into a respective one of the slots 76, and securely attached to the connector plate 70 by a cementing medium 80. The cementing medium 80 is poured into the recess formed by the raised rim 78.

The connector plate 70, with the optical-fiber bundles 34, is mounted on the circuit board 62 in the following manner. The fixing bolts 74, serving as the position-adjusting pins, are inserted into the fixing holes 66 on the chip carrier 60 and the fixing holes 68 on the circuit board 62. The tips of the bolts 74 protrude through the rear surface of the circuit board.

The optical-fiber bundles are positioned with respect to the microlens array 20 by fine adjustment of the position of the connector plate 70 on the chip carrier in parallel with the X-Y plane. This adjustment is accomplished by manipulating the bolts 74, using a manipulator (not shown) from the rear surface of the circuit board 62.

Upon completion of positioning, the connector plate 70 is securely attached to the circuit board by tightening the bolts 74 with nuts 84 from the rear surface of the circuit board 62, with washers 82 interposed between them. In this package, the processor chip 12 and the microlens array 20 are disposed in a space enclosed by the chip carrier 60 and, so, the connector plate 70 effectively prevents dirt and dust from contaminating the processor chip or the optical signal pathways.

In the aforementioned two embodiments, the positioning of the optical-fiber bundles and the microlens array is performed by the fine adjustment of the relative positions of the processor chip and the optical-fiber bundles. Needless to say, this can also be done by adjusting the position of the chip carrier as long as electrical signals used in the alignment process are available when the chip carrier is moved.

In this configuration, it is not necessary to Adjust the position of the chip carrier exactly. The fiber bundle transfers an image of an array of light spots produced by an LED array. To effectively apply the optical input signals to the processor, it is sufficient that a central part of each fiber in all of the fiber bundles in which the image is transferred without distortion coincides with a preferred portion of the microlens array. This is true as long as both the alignment dimensions of LED array and that of input cell array are fabricated with the same accuracy.

Figure 3A:
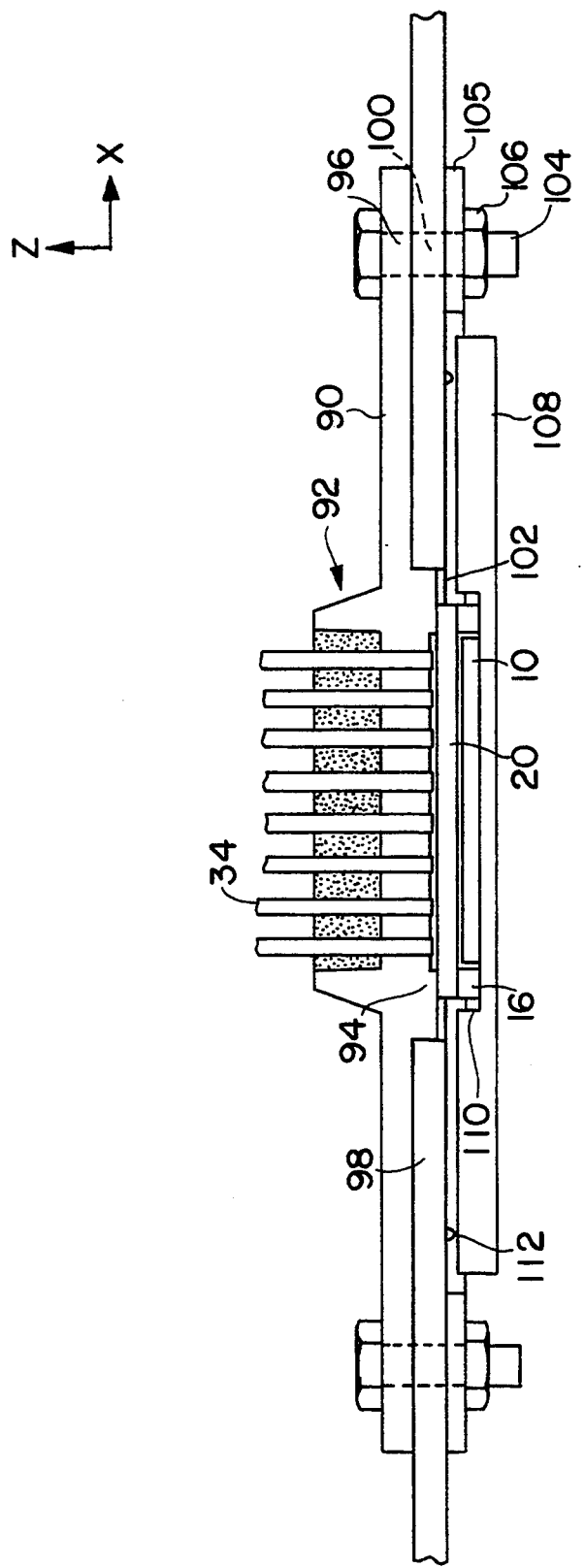
FIG. 3A is a partial cross-sectional view of the front part of an exemplary processor-chip package which is adapted to permit fine position adjustments to be performed on the chip carrier.

FIG. 3A is a cross-sectional front view of another exemplary embodiment in which the position of the chip carrier is adjusted. The connector plate 90 is of a plate shape, and has an optical-fiber bundle holder 92 at its center. The construction of this optical-fiber bundle holder is virtually the same as that of the optical-fiber bundle holders used in the aforementioned two embodiments, except that a protruding end portion 94 is provided on the bottom of the holder. As with the previous holders, the optical-fiber bundle holder 92 holds the ends of a plurality of the optical-fiber bundles 34. The connector plate 90, to which the optical-fiber bundle holder 92 is attached, has mounting holes 96 at the four corners thereof.

The circuit board 98 on which the connector plate 90 is mounted has four mounting holes 100 corresponding to the holes on the connector plate 90, and an opening 102 which is fitted to the protruding bottom portion 94 of the connector plate 90. The connector plate 90 is mounted on the circuit board 98 by inserting the protruding end portion 94 of the connector plate 90 into the opening 102, aligning the mounting holes 96 on the connector plate 90 with respect to the mounting holes 100, inserting the bolts 104 through the holes 96 and 100. Next, a retainer plate 105 is placed on the rear surface of the circuit board 98. The retainer plate 105 has an opening at its center and mounting holes at its four corners. The plate 105 is positioned with the mounting bolts 104 through these holes and nuts 106 are tightened onto the bolts from the rear surface of the retainer plate 105.

The chip carrier 108, on the other hand, is of a plate shape, and has a recess 110 at its center. The processor chip 10 is securely attached to the bottom of the recess. The microlens array 20 is securely attached to the processor chip 10 via posts 16 in the same manner as described above.

The chip carrier 108 on which the processor chip 10 and the microlens array 20 are mounted is positioned in terms of three axes (X, Y and Z) and mounted on the rear side of the circuit board 98 in the following manner.

The Z-axis positioning can be performed by precisely machining the upper surface of a transparent glass plate on which the microlens array 20 is formed. Since the upper surface of the transparent glass plate comes in contact with the protruding end portion 94 of the optical-fiber bundle holder 92, the Z-axis positioning is determined only by the contact between the protruding end portion 94 and the upper surface of the glass plate of the microlens array 20.

After positioning along the Z-axis in this way, the microlens array 20 is positioned with respect to the optical-fiber bundles 34 by finely adjusting the chip carrier in parallel with the X-Y plane. This adjustment is accomplished by manipulating position-adjusting pins (not shown) fixed on the rear surface of the chip carrier 108 with a manipulator. During the adjustment process, electrical signals from the processor chip 10 are desirably available to determine when the microlens array 20 is properly aligned with the optical-fiber bundles 34.

When mounting the chip carrier 108 on the circuit board 98, connecting pads (not shown) formed on a region other than the recess 110 of the chip carrier 108 and bumps 112 formed on the rear surface of the circuit board 98 should preferably be brought in contact only slightly, or separated from each other by a small gap.

Electrical and mechanical connection between the chip carrier 108 and the circuit board 98 is effected by solder bonding of a flip-chip type, that is, by bonding the connecting pads to the bumps 112. As stated above, the positioning of the chip carrier 108 is only a fine adjustment (e.g. ±10 mils) because the positioning between the bumps and the connecting pads is carried out by insertion of the protruding end portion 94 into the opening 102 of the circuit board 98. Thus the displacement between the connecting pads and the bumps should not cause any trouble attaching the pads to the bumps. In this exemplary embodiment of the invention, dustproofing is achieved by sealing the edges of the chip carrier 108 and the circuit board 98 with an organic cementing medium. Alternatively, if the processor chip 10 is desirably hermetically sealed, this may be accomplished by sealing the edges of the chip carrier 108 to the circuit board 98.

FIG. 3B is a cross-sectional front view of another exemplary embodiment in which the positioning of the fiber bundles 34 and the microlens array 20 is carried out by fine movement of the chip carrier. The construction of this embodiment is substantially the same as that of the embodiment shown in FIG. 3A, except that a chip carrier 109 has four mounting holes 105 corresponding to the holes 100 on the circuit board 98, and an electrical connection between the chip carrier 109 and the circuit board 98 is effected by contact between the connecting pads (not shown) formed on the chip carrier 109 and the bumps 112 formed on the rear surface of the circuit board 98.

When mounting the chip carrier 109 on the circuit board 98, upon completion of the Z-axis adjustment and the X-Y plane positioning, as described above with reference to FIG. 3A, the chip carrier 109 is securely attached to the circuit board 98 by tightening the bolts 104 through the holes 96, 100 and 105 with nuts 106 from the rear surface of the circuit board 98, with spring washers 107 interposed between them. As a result, the connecting pads formed on the chip carrier 109 and the bumps 112 formed on the circuit board 98 are held in compression to form good electrical contacts.

Next, a carrier package for a processor chip which includes an array of light-emitting elements which produce optical output signals is described. This package has a construction such that one package serves one fiber bundle. FIG. 4A is a partial cross-sectional front view of an exemplary package for an array of light-emitting elements, FIG. 4B is a top plan view thereof, FIG. 4C a side view thereof, and FIG. 4D an exploded perspective view thereof. The cross section view shown in FIG. 4A represents the section taken along the line B—B in FIG. 4B.

In FIGS. 4A through 4D, An LED chip 120 having an LED array as a light-emitting element array is securely attached to a container-like chip carrier 123 via a sub-carrier 122. A microlens array 128 is bonded, by an adhesive, to four supporting posts 126 extending to the upper end face of the sub-carrier 122. The microlens array 128 incorporates multiple microlenses formed on a glass plate. The microlens array 128 is installed on the sub-carrier 122 in such a manner as to be substantially perfectly parallel to the surface of the LED chip 120.

Each element of the LED array in the LED chip 120 corresponds to one microlens. Consequently, the microlens array 128 is securely attached on the posts 126 after it is positioned with respect to the LED array.

The chip carrier 124 is of the same shape as the chip carrier 14 shown in FIG. 1D, with four mounting holes 125 at the four corners thereof. The chip carrier is sealed with a metallic cover 132 having a transparent glass window through which optical signals are transmitted. With this metallic seal, the inside of the chip carrier 124 containing the LED chip 120 is isolated from the ambient environment. This sealing is desirable to prevent signal distortion caused by the infiltration and adhesion of fine dust and dirt particles in path for light propagation. In addition, if the semiconductor used to form the LED chip 120 is subject to degradation due to exposure to the atmosphere, it may be desirable to hermetically seal the chip 120 in the chip carrier 124.

The metallically sealed chip carrier 124 is mounted on a circuit board 134. The circuit board 134 has an opening 136 for dissipating the heat generated in the LED chip 120. In the exemplary embodiment, a heat-conductive spacer 137 is set in the opening 136. The circuit board 134 has four mounting holes 138 and two position-adjusting pin holes 140, as in the case of the circuit board 30 shown in FIG. 1D.

When mounting the chip carrier 124 on the circuit board 134, the mounting holes on the chip carrier 124 are aligned with the mounting holes 138 on the circuit board 134. Two rows of leads 142 are provided on both sides of the chip carrier 124, as in the case of the chip carrier 14 shown in FIG. 1D. The ends of these leads are soldered to connecting pads on the circuit board 134. Thus, the chip carrier 124 is securely attached to the circuit board 134.

An adapter 148 is provided on the cover 132 to hold an optical-fiber bundle 146. This adapter 148 has an optical-fiber-bundle holder 150 at its center, facing a light-transmitting window 130 on the cover 132, and legs 152 extending in the Z-axis direction at both ends. Fixing tabs 154 extend in the X-axis direction from each of the legs 152. Each of these fixing tabs 154 has a position-adjusting pin 156 protruding downwards. The fiber-bundle holder 150 has an externally threaded protruding part 160 having a slot 158. The optical-fiber bundle 146 is held in position by a protective tube 145 having a flange 162. The tube is securely attached to the end of the optical-fiber bundle 146 and the combination is inserted into the slot 158, with a Z-axis spacer 163 interposed between the slot and the tube. An internally threaded connector 164 is then engaged with an externally threaded protruding part 160. The flange 162 of the protective tube 145 is then fastened to the upper end face of the protruding part 160.

A heat sink 166 is provided on the rear surface of the circuit board 134. The heat sink 166 has four mounting holes 168 and two position-adjusting pin holes 170.

End captivating straps 172 similar to the end captivating straps 52 shown in FIG. 1D are used to assemble the adapter 148, the chip carrier 124 the circuit board 134, and the heat sink 166. Bolts 176 are inserted through mounting holes 174 on the end captivating straps 172, the mounting holes 125 on the chip carrier 124, the mounting holes 138 on the circuit board 134 and the mounting holes 168 on the heat sink 166, and then fastened loosely with nuts 178 from the rear surface of the heat sink 166. Since the nuts 178 are only loosely fastened, the adapter 148 can be moved parallel with the X-Y plane.

The position-adjusting pins 156 of the adapter 148 are inserted into holes 170 on the heat sink 166, with the tips of the pins 156 protruding from the lower surface of the heat sink 166.

The relative positioning of the optical-fiber bundle 146 and the LED array is performed by manipulating the position-adjusting pins with a manipulator (not shown). After the adapter 148 has been adjusted to place the optical fiber bundle and the LED array in the desired alignment, the nuts 178 are tightened to hold the assembly in place. Alternatively, the tolerances of the adapter 148, bolts 156, nuts 178, circuit board 140 and heat sink 170 could be designed to allow controlled movement of the adapter 148 even when the nuts are tightened. Once aligned, the adapter 148 could be cemented to the chip carrier 124 with a rigid adhesive or rigidly attached to the chip carrier 124 using bolts (not shown).

The relative positioning of the fiber bundle and the LED array is stringent, compared with that of the processor chip. That is, the locations on the cross section of the fiber bundle at which light signals are input to the optical sensor elements on the optical-fiber cell array of the processor are predetermined. It is necessary, therefore, to determine the locations on the end surface of the fiber bundles at which light is input, and to align these locations with the LED array to ensure correct optical-signal inputting.

The relative positioning of the fiber bundle ends and the LED array is desirably fixed along the three axes. The Z-axis adjustment is accomplished by interposing a spacer 163 between the lower surface of the flange 162 on the protecting tube 145 for the fiber bundle 146 and the upper surface of the protruding part 160, as mentioned above, and adjusting the spacer 163 so that the end face of the bundle comes in contact with the glass window 130.

Individual elements (corresponding to bit numbers) of the LED array inherently correspond to individual optical-input sensor arrays (input bit numbers) on the processor. Consequently, it is desirable to input the collimated light emitted by an LED element to specific locations on the end face of the fiber bundle in order to adjust relative position between the LED array and the fiber bundle. In one exemplary alignment scheme, light beams are emitted from two elements at the diagonal points on the LED array, and the adjusting pins 156 of the package are manipulated while monitoring to see if the transmitted light beams are input to the aimed optical-sensor elements of the processor. This monitoring may be performed visually at the surface of the processor chip or by monitoring output signals produced by the processor chip which indicate that specific optical-sensor elements (e.g. the extreme diagonal elements) have been activated.

The adjustment method is similar to that for the processor package, as described above. Since coherent bundles are used as the fiber bundles, arrays of light signals are transmitted from the input end face to the output end face while maintaining their respective relative positions on the input end face. That is, physical plain dimension of light beams array emitted by LED elements on LED chip is maintained through the fiber bundles. As a result, all the light output signals from the LED array are properly input to the optical-input cell array so long as the machining accuracy of the optical-input sensor array and the LED array on the processor is the same, and so long as light beams at both end at the diagonal points in the LED array are input properly to the processor.

After it is confirmed that the output light signals match the input light signals, that is, the signals for input bit numbers are properly processed in the processor, the bolts 176 and the nuts 178 are tightened. This operation is performed for the same number of the LED array packages as the number of the fiber bundles.

Assuming that data to the processor chip, and the optical-input bits of control signals are 4028-bit parallel inputs in the processor architecture, the 4028-bit parallel optical inputs are executed in the package shown in FIG. 1D, and the required number of electrical input/output terminals is 250 pins. On the other hand, assuming that 32 packages are required on the output side, and each of the optical outputs is 128 bits wide, each package on the output side has terminals handling 128 bits of optical parallel outputs. That is, 128 bits of driving electrical signal inputs and a few other electrical inputs. These numbers of electrical input/output terminals on both packages can be easily realized with the state-of-the-art technology. By using optical-signal input and output signals, the performance of the processor using both packages can be dramatically improved.

The invention claimed is:

1. A chip package holding a light-emitting array integrated circuit chip having an electrical-signal input/output section, and an optical-signal output section which has a predetermined number of bit positions, said chip package comprising:

a microlens array provided on said chip and having multiple microlenses each corresponding to a respectively different one of said bit positions and which convey optical control and data signals in parallel from the optical-signal output section of the processor chip;

a component provided on an upper part of said microlens array and adapted to fix a plurality of optical-signal transmitting elements in a predetermined spatial position, to convey, through said optical-signal transmitting elements, multiple parallel control bits and data bits of optical signals to be output from said processor chip via said microlens array and said optical-signal output section; and adjusting means for adjusting one of the component and the processor chip in position;

wherein the processor chip includes means, coupled to the electrical signal input/output section, for causing the optical-signal output section to produce optical signals at predetermined locations in the optical signal output section, while the adjusting means is adjusting the position of the one of the component and the processor chip, to facilitate alignment of the optical signal transmitting elements with the optical-signal output section.

2. A chip package holding an integrated circuit (IC) chip having an electrical-signal input/output section and an optical-signal input section which has a predetermined number of bit positions, said IC chip being adapted to perform digital data processing, said chip package comprising:

a microlens array provided on an upper part of said IC chip and having multiple microlenses, each corresponding to a respectively different one of said bit positions;

a container-like chip carrier which holds said IC chip and said microlens array and which has a group of electrical-signal input/output terminals that are connected to the electrical-signal input/output section of said IC chip;

a cover bonded to said chip carrier to seal said chip carrier and having a window for optical-signal input to said microlens array;

a connector plate holding a plurality of optical-signal transmitting elements which transmit a respective plurality of optical signals en bloc to be applied to said optical-signal input section via said cover window and said microlens array; and adjusting means for adjusting the connector plate in position relative to the IC chip;

wherein the IC chip includes means, coupled to the optical-signal input section for generating signals via the electrical-signal input/output section while the relative positions of the component and the processor chip are adjusted via the adjusting means, to facilitate alignment of the optical signal transmitting elements with the optical-signal input section and;

wherein, upon achieving alignment, said chip carrier and said connector plate are securely attached to a circuit board in configuration where said optical-signal transmitting elements are fixedly positioned with respect to said IC chip, and said electrical input/output terminal group is connected to said circuit board.

3. A chip package holding an integrated circuit (IC) chip having an electrical-signal input/output section and an optical-signal input section which has a predetermined number of bit positions, said IC chip being adapted to perform digital data processing, said chip package comprising:

a microlens array provided on an upper part of said IC chip and having multiple microlenses, each corresponding to a respectively different one of said bit positions;

a chip carrier which holds said IC chip and said microlens array and which has a group of electrical-signal input/output terminals that are connected to the electrical-signal input/output section of said IC chip;

a connector plate holding a plurality of optical-signal transmitting elements which transmit a respective plurality of optical signals en bloc to be applied to said optical-signal input section via said microlens array; and adjusting means for adjusting one of the connector plate and the IC chip in position;

wherein the IC chip includes means, coupled to the optical-signal input section for generating signals via the electrical-signal input/output section, while the adjusting means is adjusting the position of the one of the connector plate and the IC chip to facilitate alignment of the optical signal transmitting elements with the optical-signal input section and;

wherein, upon achieving alignment, said chip carrier and said connector plate are securely attached to a circuit board in the state where said optical-signal transmitting elements are fixedly positioned with respect to said IC chip, and said electrical input/output terminal group is connected to said circuit board.

4. A chip package holding an integrated circuit (IC) chip having an electrical-signal input/output section and an optical-signal input section which has a predetermined number of bit positions, said IC chip being adapted to perform digital data processing, said chip package comprising:

a microlens array provided on an upper part of said IC chip and having multiple microlenses, each corresponding to a respectively different one of said bit positions;

a chip carrier which holds said IC chip and said microlens array and which has a group of electrical-signal input/output terminals that are connected to the electrical-signal input/output section of said IC chip; and a connector plate holding a plurality of optical-signal transmitting elements which transmit a respective plurality of optical signals en bloc to be applied to said optical-signal input section via said microlens array;

means for coupling the chip carrier and the connector plate to a circuit board having a front side, a rear side and an opening from the front side to the rear side;

wherein, said connector plate is securely attached by said coupling means to the front side of the circuit board, said chip carrier is positioned with respect to and held in a fixed position with respect to said optical-signal transmitting elements via said opening from the rear side of said circuit board, and said electrical input/output terminal group are connected to said circuit board.

5. A chip package as set forth in claim 1, 2, 3 or 4, wherein said optical-signal transmitting elements are a plurality of optical fibers in an optical-fiber bundle.

6. A chip package as set forth in claim 2, 3 or 4, wherein said optical-signal transmitting elements are inserted into a hole provided on said connector plate, and securely attached to said connector plate with a cementing medium.

7. A chip package holding an integrated circuit (IC) chip having an electrical-signal input/output section and an optical-signal input section which has a predetermined number of bit positions, said IC chip being adapted to perform digital data processing, said chip package comprising:

a microlens array provided on an upper part of said IC chip and having multiple microlenses, each corresponding to a respectively different one of said bit positions;

a container-like chip carrier which holds said IC chip and said microlens array and which has a group of electrical-signal input/output terminals that are connected to the electrical-signal input/output section of said IC chip;

a cover bonded to said chip carrier to seal said chip carrier and having a window for optical-signal input to said microlens array; and a connector plate holding a plurality of optical-signal transmitting elements which transmit a respective plurality of optical signals en bloc to be applied to said optical-signal input section via said cover window and said microlens array, wherein said connector plate has position-adjusting pins protruding downwards, which are passed through holes provided on circuit board;

wherein, said chip carrier and said connector plate are securely attached to said circuit board in a configuration where said optical-signal transmitting elements are fixedly positioned with respect to said IC chip, and said electrical input/output terminal group is connected to said circuit board.

8. A chip package holding an integrated circuit (IC) chip having an electrical-signal input/output section and an optical-signal input section which has a predetermined number of bit positions, said IC chip being adapted to perform digital data processing, said chip package comprising:

a microlens array provided on the upper part of said IC chip and having multiple microlenses, each corresponding to a respectively different one of said bit positions;

a chip carrier which holds said IC chip and said microlens array and which has a group of electrical-signal input/output terminals that are connected to the electrical-signal input/output section of said IC chip; and a connector plate holding a plurality of optical-signal transmitting elements which transmit a respective plurality of optical signals en bloc to be applied to said optical-signal input section via said microlens array;

wherein, said connector plate is securely attached to a circuit board having an opening, said chip carrier is positioned with respect to and held in a fixed position with respect to said optical-signal transmitting elements via said opening from the rear side of said circuit board, said electrical input/output terminal group is connected to said circuit board and said chip carrier has position-adjusting pins protruding downwards.

9. A chip package which holds a light-emitting element array which generates optical output signals having a predetermined number of bit positions, said chip package comprising:

a microlens array having multiple microlenses each corresponding to a respectively different one of said bit positions;

a container-like chip carrier holding a chip and said microlens array and having a group of electrical-signal input/output terminals;

a cover bonded to said chip carrier to seal said chip carrier and having a window which passes said optical output signals from said chip;

an adapter which holds optical-signal transmitting elements that transmit a plurality of optical signals en bloc to output optical signals from said chip through said cover window; and a heat sink which is coupled to said chip to dissipate heat generated by said light-emitting element array;

wherein, said chip carrier and said adapter are securely attached to a front surface of a circuit board in a configuration where said optical-signal transmitting elements are held in a fixed position with respect to said IC chip, said electrical input/output terminal group is connected to the circuit board, and said heat sink is securely attached to said circuit board.

10. A chip package as set forth in claim 9, wherein said optical-signal transmitting elements are a plurality of optical fibers contained in an optical-fiber bundle.

11. A chip package which holds a light-emitting element array that generates optical output signals having a predetermined number of bit positions, said chip package comprising:

a microlens array having multiple microlenses each corresponding to a respectively different one of said bit positions;

a container-like chip carrier holding said chip and said microlens array and having a group of electrical-signal input/output terminals;

a cover bonded to said chip carrier to seal said chip carrier and having a window which passes said optical output signals from said chip;

an adapter which holds optical-signal transmitting elements that transmit a plurality of optical signals en bloc to output optical signals from said chip through said cover window; and a heat sink which is coupled to said IC Chip to dissipate heat generated by said light-emitting element array;

wherein, said chip carrier and said adapter are securely attached to a front surface of a circuit board in a configuration where said optical-signal transmitting elements are held in a fixed position with respect to said IC Chip, said electrical input/output terminal group is connected to the circuit board, said heat sink is securely attached to said circuit board, said optical-signal transmitting elements are a plurality of optical fibers contained in an optical-fiber bundle, and said adapter has position-adjusting pins protruding downwards, said pins being passed through holes provided on the circuit board and holes provided on the heat sink.

12. A chip package holding an integrated circuit (IC) chip having an electrical-signal input/output section and an optical-signal input section which has a predetermined number of bit positions, said IC chip being adapted to perform digital data processing, said chip package comprising:

a microlens array provided on an upper part of said IC chip and having multiple microlenses, each corresponding to a respectively different one of said bit positions;

a chip carrier which holds said IC chip and said microlens array and which has a group of electrical-signal input/output terminals that are connected to the electrical-signal input/output section of said IC chip; and a connector plate holding a plurality of optical-signal transmitting elements which transmit a respective plurality of optical signals en bloc to be applied to said optical-signal input section via said microlens array;

wherein, said chip carrier and said connector plate are securely attached to a circuit board in the state where said optical-signal transmitting elements are fixedly positioned with respect to said IC chip, and said electrical input/output terminal group is connected to said circuit board and the connector plate includes position-adjusting pins which protrude downwards and are passed through holes provided on the circuit board.

* * * * *

UNITED STATES PATENT AND TRADEMARK OFFICE
CERTIFICATE OF CORRECTION

PATENT NO. : 5,359,208
DATED : October 25, 1994
INVENTOR(S) : Katsuki, et. al.

It is certified that error appears in the above-indentified patent and that said Letters Patent is hereby corrected as shown below:

Column 14, line 44, after the word "chip" insert --, --.
Column 15, line 52, after the word "on" insert --a--.
Column 17, line 1, the word "Chip" should be --chip--.
Column 17, line 9, the word "Chip" should be --chip--.

Signed and Sealed this

Seventh Day of March, 1995

*Attest:*

BRUCE LEHMAN

*Attesting Officer*     *Commissioner of Patents and Trademarks*